United States Patent
Juan et al.

(10) Patent No.: US 11,917,802 B2
(45) Date of Patent: Feb. 27, 2024

(54) CONDUCTIVE LONG FIBER THERMOPLASTIC COMPOUNDS FOR ELECTROMAGNETIC SHIELDING

(71) Applicant: Avient Corporation, Avon Lake, OH (US)

(72) Inventors: Raul Juan, San Mateo de Gallego (ES); Javier Puyalto, Barbastro (ES); Renlong Gao, Avon, OH (US); David Sanchez, San Sebastian de los Reyes (ES)

(73) Assignee: Avient Corporation, Avon Lake, OH (US)

( * ) Notice: Subject to any disclaimer, the term of this patent is extended or adjusted under 35 U.S.C. 154(b) by 387 days.

(21) Appl. No.: 17/285,699

(22) PCT Filed: Oct. 14, 2019

(86) PCT No.: PCT/US2019/056116
§ 371 (c)(1),
(2) Date: Apr. 15, 2021

(87) PCT Pub. No.: WO2020/081451
PCT Pub. Date: Apr. 23, 2020

(65) Prior Publication Data
US 2021/0345529 A1    Nov. 4, 2021

Related U.S. Application Data
(60) Provisional application No. 62/746,129, filed on Oct. 16, 2018.

(51) Int. Cl.
*H05K 9/00* (2006.01)
(52) U.S. Cl.
CPC .................. *H05K 9/009* (2013.01)

(58) Field of Classification Search
CPC .............. H05K 9/009; C08K 2201/001; C08K 2201/004; C08K 7/06; C08K 9/02;
(Continued)

(56) References Cited

U.S. PATENT DOCUMENTS 5,540,797 A   7/1996 Wilson
5,869,178 A   2/1999 Kusy et al.
(Continued)

FOREIGN PATENT DOCUMENTS

WO    2008078847 A1    7/2008

OTHER PUBLICATIONS

Baerdemaeker et al: An introduction to Metal Fiber Technology, https://www.bekaert.com/-/media/Files/Download-Files/BFT/White-papers/Whitepaper-1--Metal-fiber-technology-EN.pdf, Responsible editor: Yannick Lescanne—2017.

*Primary Examiner* — Mark Kopec
*Assistant Examiner* — Jaison P Thomas
(74) *Attorney, Agent, or Firm* — David V. Monateri; Michael J. Sambrook

(57) ABSTRACT

Thermoplastic compounds in the form of a pellet include thermoplastic resin and conductive fibers. The conductive fibers are enveloped by the thermoplastic resin and distributed within the pellet such that each of at least a portion of the conductive fibers is substantially surrounded by the thermoplastic resin and thereby substantially separated from physical contact with any other of the conductive fibers. Additionally, at least a portion of the conductive fibers includes long fibers. The thermoplastic compound, when molded at a thickness of about 3.2 mm, has an electromagnetic shielding effectiveness across a range of frequencies from about 0.5 GHz to about 2.0 GHz of at least about 60 dB according to ASTM D4935, which makes the thermo-
(Continued)

plastic compound useful for molding thermoplastic articles for shielding against electromagnetic interference.

24 Claims, 10 Drawing Sheets

(58) Field of Classification Search
CPC .......... C08K 3/08; B29B 7/007; B29B 7/726; B29B 9/12; B29B 9/14; B29B 9/06; B29B 7/90
See application file for complete search history.

(56) References Cited

U.S. PATENT DOCUMENTS

| | | | |
|---|---|---|---|
| 7,078,098 B1* | 7/2006 | Woodside | C08K 9/04 428/297.1 |
| 2002/0108699 A1 | 8/2002 | Cofer et al. | |
| 2006/0110599 A1 | 5/2006 | Honma et al. | |
| 2007/0134482 A1* | 6/2007 | Hager | H01B 1/22 428/292.1 |
| 2013/0177765 A1* | 7/2013 | Lim | H01B 1/24 428/407 |
| 2014/0093712 A1 | 4/2014 | Tong et al. | |
| 2014/0272417 A1* | 9/2014 | Zeidan | B29B 7/90 428/407 |

\* cited by examiner

CONDUCTIVE LONG FIBER
THERMOPLASTIC COMPOUNDS FOR
ELECTROMAGNETIC SHIELDING

CLAIM OF PRIORITY

This application claims priority from U.S. Provisional Patent Application Ser. No. 62/746,129 and filed on Oct. 16, 2018, which is incorporated by reference.

FIELD OF THE INVENTION

This invention relates to conductive long fiber thermoplastic compounds and thermoplastic articles molded therefrom which are useful for shielding against electromagnetic interference.

BACKGROUND OF THE INVENTION

Electronic systems, devices, and equipment are ubiquitous. The modern world relies upon electronics across numerous markets and industries such as aerospace, automotive, consumer, entertainment, financial, industrial, logistics, manufacturing, medical, retail, telecommunications, and transportation, among many others.

With the proliferation of electronics, demand increasingly exists for means for shielding electronics from electromagnetic interference (EMI), which is also sometimes called radio frequency interference (RFI). In general, EMI/RFI is the electromagnetic field generated by an external source such as a nearby electronic device. Undesirably, EMI/RFI can negatively affect the performance or even disrupt the operation of other nearby electronic devices.

Typically, electronics can be guarded from EMI/RFI by surrounding the electronics with a conventional shielding material such as a metal or a conductive plastic. However, such conventional shielding materials can have drawbacks. For example, metals can be expensive and relatively difficult to process, form, and manufacture into components for use in EMI/RFI shielding applications. Metals also tend to add weight to the end-use product, which often is undesirable. Conventional conductive plastics can alleviate some of the drawbacks of metals, although drawbacks still exist.

Conventional conductive plastics typically are made by incorporating a conductive filler, such as a metal powder or metal fiber, into a polymer matrix to provide a conductive plastic material. Conveniently, the conductive plastic material can be provided in the form of granules or pellets, which can be subsequently processed into a formed part by forming processes such as injection molding or extrusion. However, to meet or exceed typical EMI/RFI shielding requirements, relatively higher amounts of the conductive filler can be required. Disadvantageously, conductive plastic materials including relatively higher amounts of the conductive filler can have relatively higher costs and relatively greater difficulties with processing, forming, and manufacturing as compared to conductive plastic materials including relatively lower amounts of the conductive filler. Additionally, relatively higher amounts of the conductive filler can contribute to undesirable added weight in the end-use product.

SUMMARY OF THE INVENTION

Consequently, a need exists for a conductive plastic material which can meet or exceed typical EMI/RFI shielding requirements while avoiding or minimizing the drawbacks discussed above.

The aforementioned needs are met by one or more aspects of the invention.

One aspect of the invention is thermoplastic compounds as described in this disclosure.

Another aspect of the invention is thermoplastic articles molded from the thermoplastic compounds as described in this disclosure.

A further aspect of the invention is methods of making thermoplastic compounds as described in this disclosure.

According to aspects of the invention, thermoplastic compounds in the form of a pellet include thermoplastic resin and conductive fibers. The conductive fibers are enveloped by the thermoplastic resin and distributed within the pellet such that each of at least a portion of the conductive fibers is substantially surrounded by the thermoplastic resin and thereby substantially separated from physical contact with any other of the conductive fibers. Additionally, at least a portion of the conductive fibers includes long fibers. The thermoplastic compound, when molded at a thickness of about 3.2 mm, has an electromagnetic shielding effectiveness across a range of frequencies from about 0.5 GHz to about 2.0 GHz of at least about 60 dB according to ASTM D4935, which makes the thermoplastic compound useful for molding thermoplastic articles for shielding against electromagnetic interference.

Features of the invention will become apparent with reference to the following embodiments. There exist various refinements of the features noted in relation to the above-mentioned aspects of the invention. Additional features may also be incorporated in the above-mentioned aspects of the invention. These refinements and additional features may exist individually or in any combination. For instance, various features discussed below in relation to any of the described aspects of the invention may be incorporated into any other of the described aspects of the invention alone or in any combination unless specifically described otherwise.

EMBODIMENTS OF THE INVENTION

Figure 1:
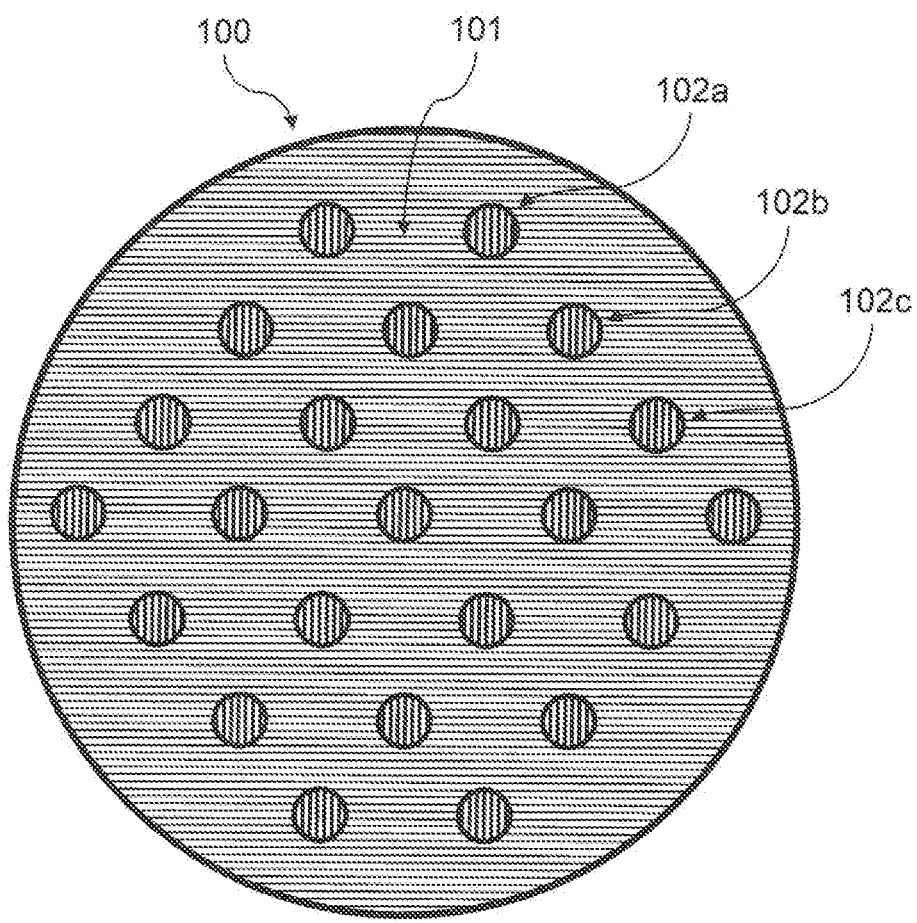
FIG. 1 is a cross-section view of a thermoplastic compound in the form of a pellet according to a first exemplary embodiment of the invention in which the conductive fibers are enveloped by the thermoplastic resin and distributed within the pellet such that each of at least a first exemplary portion of the conductive fibers is substantially surrounded by the thermoplastic resin and thereby substantially separated from physical contact with any other of the conductive fibers.

In some embodiments, the invention is directed to thermoplastic compounds.

In other embodiments, the invention is directed to thermoplastic articles molded from the thermoplastic compounds.

In further embodiments, the invention is directed to methods of making the thermoplastic compounds.

Required and optional features of these and other embodiments of the invention are described.

As used herein, the term "compound" means a composition or mixture resulting from melt mixing, or compounding, a neat polymer and at least one other ingredient including but not limited to one or more additives, or one or more other polymers, or both.

As used herein, the term "fiber" means a single filament or a bundle of two or more filaments.

As used herein, the term "free of" a certain component or substance means, in some embodiments, that no amount of that component or substance is intentionally present, and, in other embodiments, that no functionally effective amount of that component or substance is present, and, in further embodiments, that no amount of that component or substance is present.

As used herein, the term "length" means the longest dimension of an object.

As used herein, the term "long fiber" means a fiber having a length that is substantially equivalent to the length of the pellet of the thermoplastic compound that includes the fiber, the pellet being intended for further processing to form a thermoplastic article other than the pellet. Thermoplastic compounds including long fibers can be made using a pultrusion process, which involves pulling continuous tows of the fiber through a resin melt and cooling to provide a pultruded profile and chopping the pultruded profile to provide pellets, as further described herein below.

As used herein, the term "molded from" means, with respect to an article (or component of an article) and a thermoplastic material, that the article (or component of the article) is molded, extruded, shaped, formed, pressed, or otherwise made from the thermoplastic material under sufficient heating to enable such molding. As such, the term "molded from" means, in some embodiments, the article (or component of an article) can comprise, consist essentially of, or consist of, the material; and, in other embodiments, the article (or component of an article) consists of the material because the article (or component of an article) is, for example, made by an injection molding process or by an extrusion process.

As used herein, the term "short fiber" means a fiber having a length that is less than the shortest dimension of the pellet of the thermoplastic compound that includes the fiber, the pellet being intended for further processing to form a thermoplastic article other than the pellet. Thermoplastic compounds including short fibers can be made using conventional compounding and extrusion processes which involve adding the short fiber as chopped fiber to a resin melt and melt mixing to provide a compound and extruding the compound in the form of a pellet.

As used herein, the term "substantially" means, with respect to a particular value, state, or condition, a modified value, state, or condition equal to, in some embodiments, plus or minus ten percent (10%), or, in other embodiments, plus or minus five percent (5%), or, in further embodiments, plus or minus one percent (1%), or, in even further embodiments, plus or minus one-tenth percent (0.1%) of the particular value, state, or condition.

Thermoplastic Compounds

Some aspects of the invention are directed to thermoplastic compounds. The thermoplastic compounds are in the form of a pellet and include thermoplastic resin and conductive fibers.

According to the invention, the conductive fibers are enveloped by the thermoplastic resin and distributed within the pellet such that each of at least a portion of the conductive fibers is substantially surrounded by the thermoplastic resin and thereby substantially separated from physical contact with any other of the conductive fibers.

For example, in some embodiments, each of at least about 50%, or about 60%, or about 70%, or about 80%, or about 90%, or about 99%, or about 100% of the conductive fibers included in the thermoplastic compound is substantially surrounded by the thermoplastic resin and thereby substantially separated from physical contact with any other of the conductive fibers.

With reference to FIG. 1, a first exemplary embodiment of a thermoplastic compound in the form of a pellet 100 is described. Pellet 100 includes thermoplastic resin 101 and conductive fibers 102a, 102b, 102c, etc., which is intended to refer to all conductive fibers 102 distributed within the pellet 100. The conductive fibers 102a, 102b, 102c, etc., are enveloped by the thermoplastic resin 101 and distributed within the pellet 100 such that each of at least a first exemplary portion of the conductive fibers 102a, 102b, 102c, etc., is substantially surrounded by the thermoplastic resin 101 and thereby substantially separated from physical contact with any other of the conductive fibers 102a, 102b, 102c, etc.

Figure 2:
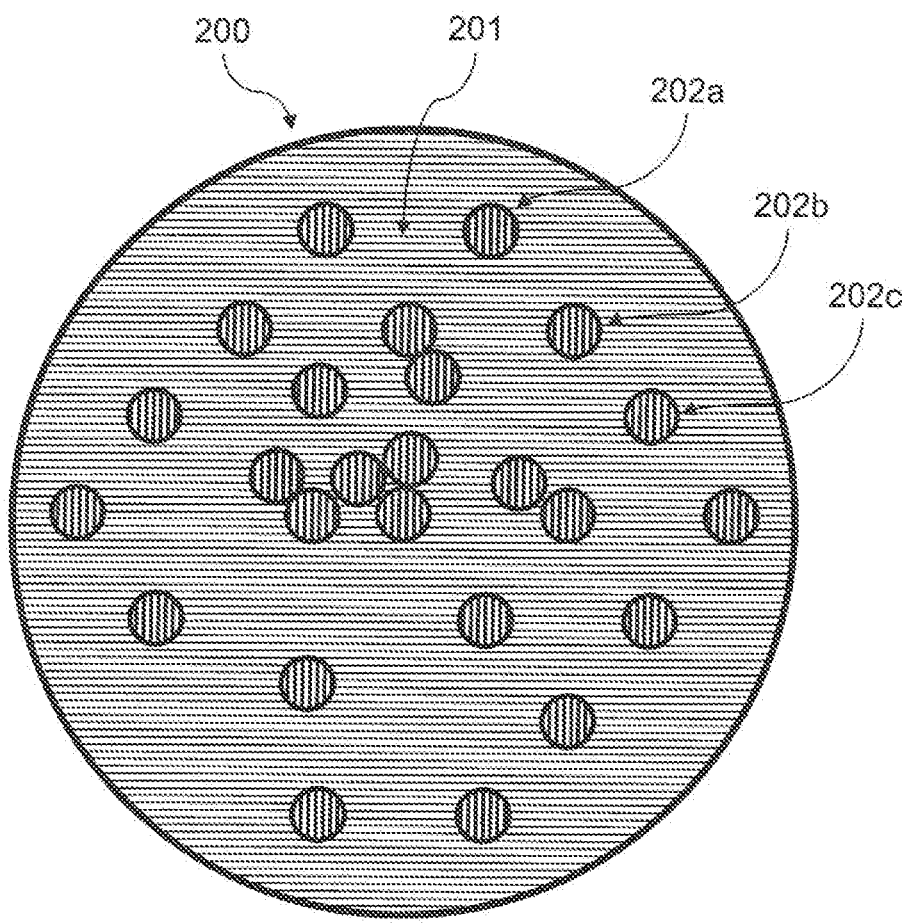
FIG. 2 is a cross-section view of a thermoplastic compound in the form of a pellet according to a second exemplary embodiment of the invention in which the conductive fibers are enveloped by the thermoplastic resin and distributed within the pellet such that each of at least a second exemplary portion of the conductive fibers is substantially surrounded by the thermoplastic resin and thereby substantially separated from physical contact with any other of the conductive fibers.

With reference to FIG. 2, a second exemplary embodiment of a thermoplastic compound in the form of a pellet 200 is described. Pellet 200 includes thermoplastic resin 201 and conductive fibers 202a, 202b, 202c, etc., which is intended to refer to all conductive fibers 202 distributed within the pellet 200. The conductive fibers 202a, 202b, 202c, etc., are enveloped by the thermoplastic resin 201 and distributed within the pellet 200 such that each of at least a second exemplary portion of the conductive fibers 202a, 202b, 202c, etc., is substantially surrounded by the thermoplastic resin 201 and thereby substantially separated from physical contact with any other of the conductive fibers 202a, 202b, 202c, etc.

Figure 3:
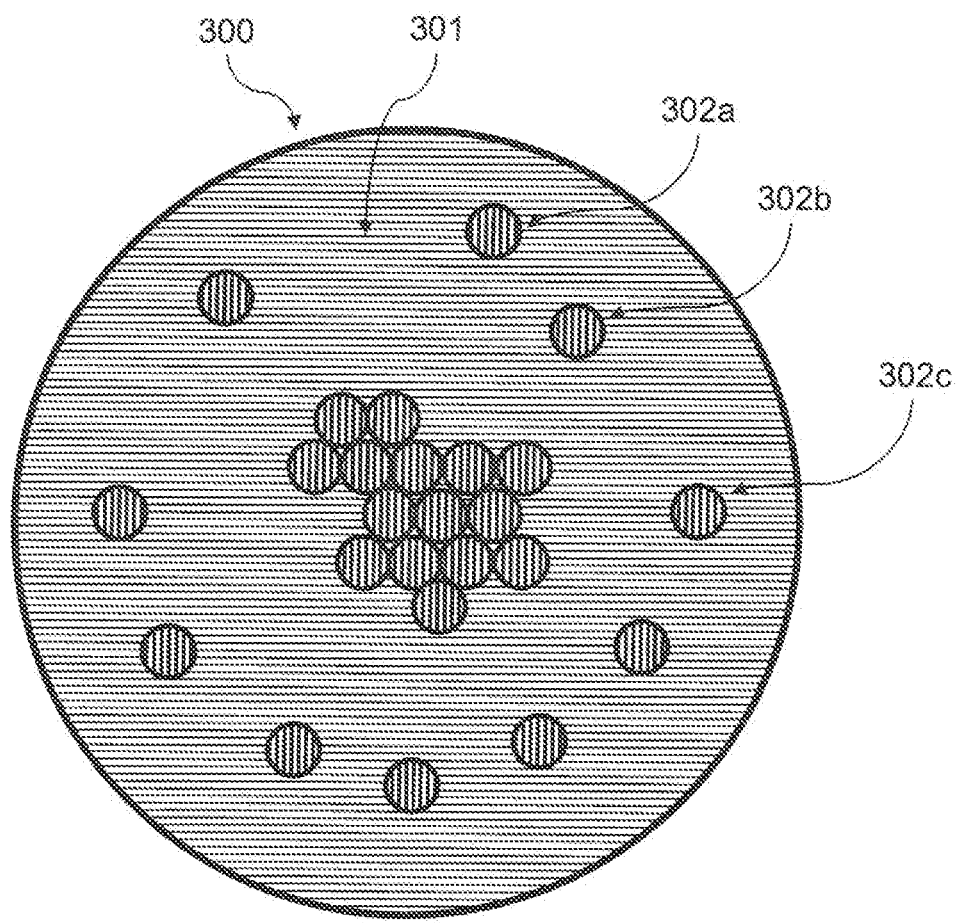
FIG. 3 is a cross-section view of a thermoplastic compound in the form of a pellet according to a third exemplary embodiment of the invention in which the conductive fibers are enveloped by the thermoplastic resin and distributed within the pellet such that each of at least a third exemplary portion of the conductive fibers is substantially surrounded by the thermoplastic resin and thereby substantially separated from physical contact with any other of the conductive fibers.

With reference to FIG. 3, a third exemplary embodiment of a thermoplastic compound in the form of a pellet 300 is described. Pellet 300 includes thermoplastic resin 301 and conductive fibers 302a, 302b, 302c, etc., which is intended to refer to all conductive fibers 302 distributed within the pellet 300. The conductive fibers 302a, 302b, 302c, etc., are enveloped by the thermoplastic resin 301 and distributed within the pellet 300 such that each of at least a third exemplary portion of the conductive fibers 302a, 302b, 302c, etc., is substantially surrounded by the thermoplastic resin 301 and thereby substantially separated from physical contact with any other of the conductive fibers 302a. 302b, 302c, etc., including all other conductive fibers 302 distributed within the pellet 300.

In contrast with the exemplary embodiments described above, with reference to FIG. 4, a first comparative thermoplastic compound in the form of a pellet 400, which is not exemplary of the invention, is described. Pellet 400 includes thermoplastic resin 401 and conductive fibers 402a, 402b, 402c, etc., which is intended to refer to all conductive fibers 402 distributed within the pellet 400. Notably, the conductive fibers 402a, 402b, 402c, etc., are configured as a first comparative example of a collective bundle of a plurality of fibers. As such, although the collective bundle is enveloped by the thermoplastic resin 401, the conductive fibers 402a, 402b, 402c, etc., are not distributed within the pellet 400 such that each of at least a portion of the conductive fibers 402a, 402b, 402c, etc., is substantially surrounded by the thermoplastic resin 401 and thereby substantially separated from physical contact with any other of the conductive fibers 402a, 402b, 402c, etc.

In further contrast with the exemplary embodiments described above, with reference to FIG. 5, a second comparative thermoplastic compound in the form of a pellet 500, which is not exemplary of the invention, is described. Pellet 500 includes thermoplastic resin 501 and conductive fibers 502a, 502b, 502c, etc., which is intended to refer to all conductive fibers 502 distributed within the pellet 500. Notably, the conductive fibers 502a, 502b, 502c, etc., are configured as a second comparative example of a collective bundle of a plurality of fibers. As such, although the collective bundle is enveloped by the thermoplastic resin 501, the conductive fibers 502a, 502b, 502c, etc., are not distributed within the pellet 500 such that each of at least a portion of the conductive fibers 502a, 502b, 502c, etc., is substantially surrounded by the thermoplastic resin 501 and thereby substantially separated from physical contact with any other of the conductive fibers 502a, 502b, 502c, etc.

Figure 4:
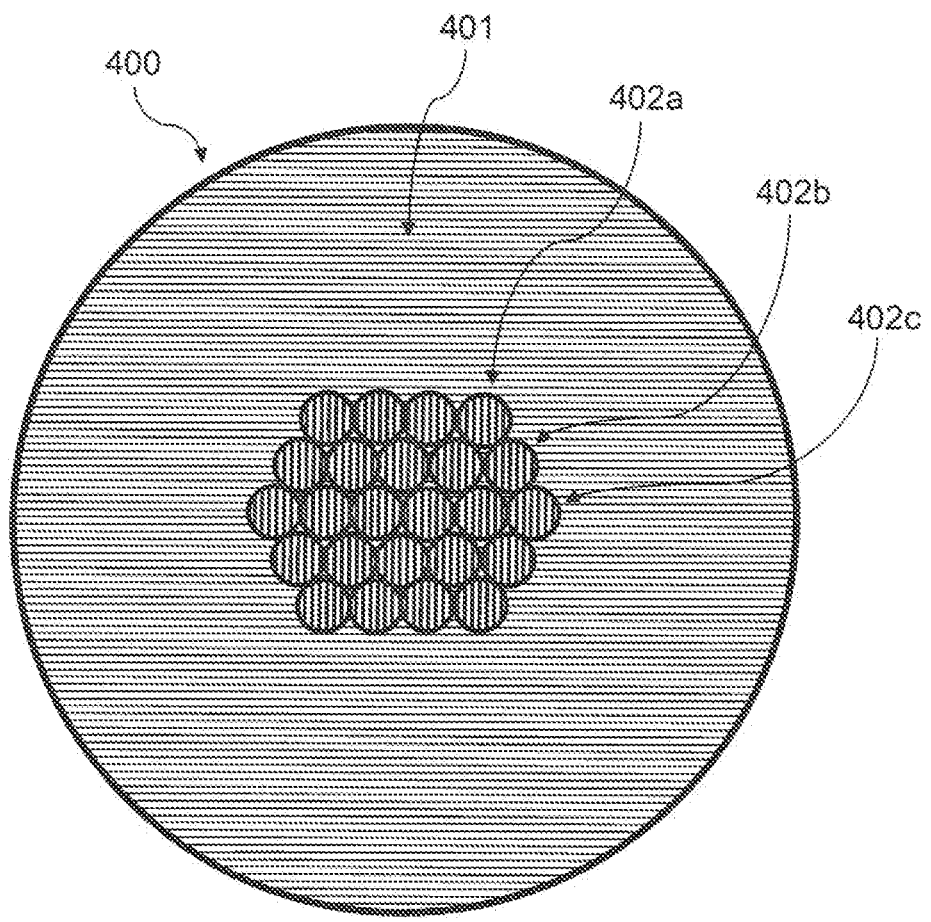
FIG. 4 is a cross-section view of a first comparative thermoplastic compound in the form of a pellet, which is not exemplary of the invention, in which the conductive fibers are not distributed within the pellet such that each of at least a portion of the conductive fibers is substantially surrounded by the thermoplastic resin and thereby substantially separated from physical contact with any other of the conductive fibers.
Figure 5:
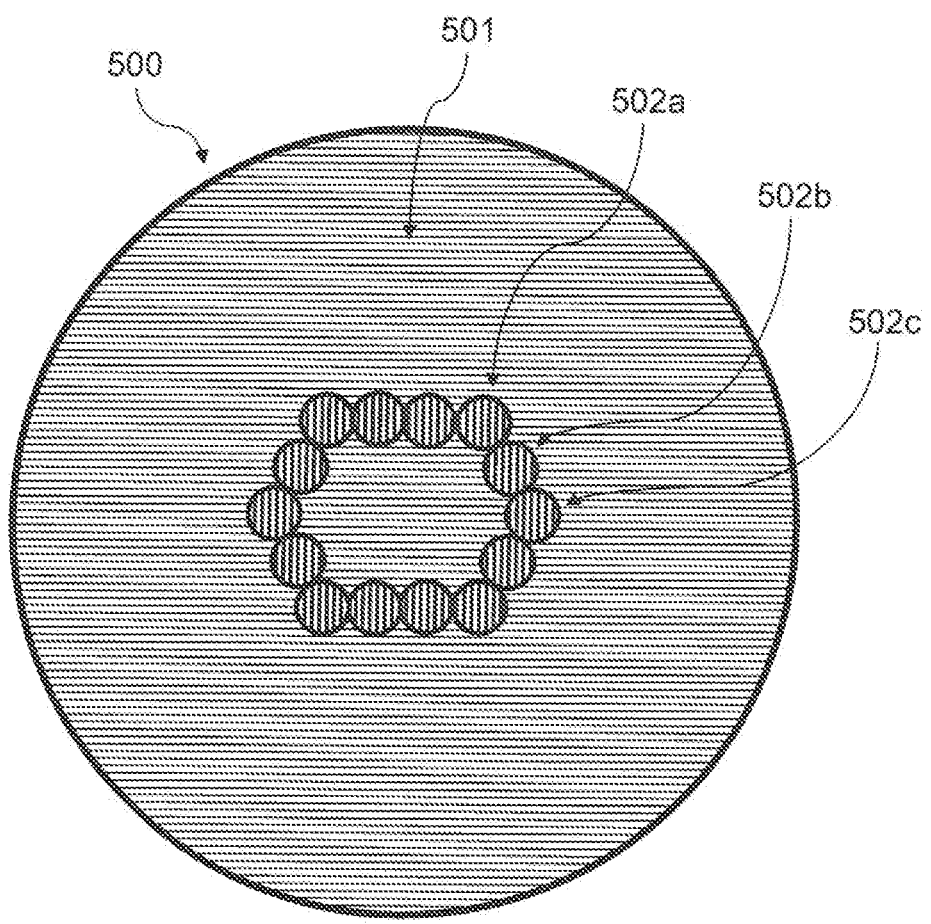
FIG. 5 is a cross-section view of a second comparative thermoplastic compound in the form of a pellet, which is not exemplary of the invention, in which the conductive fibers are not distributed within the pellet such that each of at least a portion of the conductive fibers is substantially surrounded by the thermoplastic resin and thereby substantially separated from physical contact with any other of the conductive fibers.

Pursuant to aspects of the invention, it is possible to achieve improved electromagnetic shielding effectiveness in thermoplastic articles molded from thermoplastic compounds in the form of pellets when the conductive fibers are distributed within the pellet according to this disclosure, for example, as exemplified by the exemplary embodiments of FIGS. 1 to 3, as opposed to when the conductive fibers are configured as a bundle, for example, as exemplified by the comparative examples of FIGS. 4 to 5. Without intending to be bound by theory, it is believed that the conductive fibers, when distributed in the pellet according to this disclosure, are more fully impregnated and more fully surrounded by the thermoplastic resin. As such, when the pellet is further processed by a melt forming process to provide a thermoplastic article, it is believed that the conductive fibers which are more fully impregnated and more fully surrounded by the thermoplastic resin are more effectively dispersed within the melted thermoplastic compound and thereby more effectively distributed within the thermoplastic article molded from the thermoplastic compound.

In contrast, it is believed that the conductive fibers, when configured as a collective bundle in the pellet, are less fully impregnated and less fully surrounded by the thermoplastic resin. Indeed, it is believed that at least some of the conductive fibers, when configured as a collective bundle in the pellet, such as fibers within the interior of the collective bundle, can have little to no wetting or coating by the thermoplastic resin. As such, when the pellet is further processed by a melt forming process to provide a thermoplastic article, it is believed that the conductive fibers which are less fully impregnated and less fully surrounded by the thermoplastic resin are less effectively dispersed within the melted thermoplastic compound and thereby less effectively distributed within the thermoplastic article.

Accordingly, without intending to be bound by theory, it is believed that a thermoplastic compound in the form of a pellet and which includes conductive fibers distributed within the pellet according to this disclosure, in turn, provides or at least contributes to more effective distribution of the conductive fibers within the thermoplastic article molded from the thermoplastic compound, and, in turn, provides or at least contributes to improved electromagnetic shielding effectiveness for a given type of conductive fiber at a given loading level in a given thermoplastic resin system.

According to the invention, at least a portion of the conductive fibers includes long fibers. That is, the fiber length of each of at least a portion of the conductive fibers is substantially equivalent to the pellet length.

For example, in some embodiments, the fiber length of each of at least about 50%, or about 60%, or about 70%, or about 80%, or about 90%, or about 99%, or about 100%, of the conductive fibers is substantially equivalent to the pellet length.

In some embodiments, the pellet length ranges from about 5 mm to about 30 mm. In other embodiments, the pellet length ranges from about 6 mm to about 12 mm.

In some embodiments, the thermoplastic compounds are free of any short fibers.

In some embodiments, each of at least the portion of the conductive fibers is oriented such that the fiber length is substantially parallel to the pellet length.

For example, in some embodiments, each of at least at least about 50%, or about 60%, or about 70%, or about 80%, or about 90%, or about 99%, or about 100%, of the conductive fibers is oriented such that the fiber length is substantially parallel to the pellet length.

According to the invention, the thermoplastic compounds, when molded at a thickness of about 3.2 mm, have an electromagnetic shielding effectiveness across a range of frequencies from about 0.5 GHz to about 2.0 GHz of at least about 60 dB according to ASTM D4935. In some embodiments, the electromagnetic shielding effectiveness across a range of frequencies from about 0.5 GHz to about 2.0 GHz is at least about 80 dB according to ASTM D4935. In other embodiments, the electromagnetic shielding effectiveness across a range of frequencies from about 0.5 GHz to about 2.0 GHz is at least about 90 dB according to ASTM D4935. In further embodiments, the electromagnetic shielding effectiveness, across a range of frequencies from about 0.5 GHz to about 2.0 GHz is at least about 95 dB according to ASTM D4935.

For example, in some embodiments, wherein the conductive fibers are present in an amount from about 10 to about 35 percent by weight of the thermoplastic compound, and wherein the conductive fibers are selected from stainless steel fibers, nickel-coated carbon fibers, and combinations thereof, the thermoplastic compounds, when molding at a thickness of 3.2 mm, have an electromagnetic shielding effectiveness across a range of frequencies from about 0.5 GHz to about 2.0 GHz of at least about 90 dB according to ASTM D4935.

For example, in other embodiments, wherein the conductive fibers are present in an amount from about 12 to about 17 percent by weight of the thermoplastic compound, and wherein the conductive fibers are selected from stainless steel fibers, nickel-coated carbon fibers, and combinations thereof, the thermoplastic compounds, when molded at a thickness of 32 mm, have an electromagnetic shielding effectiveness across a range of frequencies from about 0.5 GHz, to about 2.0 GHz is at least about 90 dB according to ASTM D4935.

In some embodiments, the thermoplastic compounds have a specific gravity of about 2.0 or less. In other embodiments, the thermoplastic compounds have a specific gravity of about 1.8 or less.

Thermoplastic Resin

According to the invention, thermoplastic compounds include thermoplastic resin.

Suitable thermoplastic resins include conventional or commercially available thermoplastic resins, which can be selected without undue experimentation by those skilled in the art based at least in part on requirements for a particular end-use application.

Non-limiting examples of suitable thermoplastic resins include polyacetals, polyacrylates, acrylonitrile butadiene styrene, polyamides, polyaliphaticetherketones, polyaryletherketones, polycarbonates, polyesters, polyimides, polyolefins, polyphenylene ethers, polystyrenes, polysulfones, polyurethanes, polyvinyl halides, thermoplastic elastomers, and combinations thereof. The foregoing includes, as applicable, homopolymers thereof, copolymers thereof, blends or alloys thereof, and modifications (e.g., by grafting) thereof. The foregoing also includes, as applicable, all possible molecular configurations thereof, such as isotactic, syndiotactic, and random molecular configurations.

For example, in some embodiments, the thermoplastic resin is selected from nylon-6, nylon-6,6, polycarbonate, polybutylene terephthalate, high density polyethylene, polypropylene, syndiotactic polystyrene, and combinations thereof.

Non-limiting examples of commercially available thermoplastic resins include those identified in Table 2 herein below.

Conductive Fibers

According to the invention, thermoplastic compounds include conductive fibers.

Suitable conductive fibers include conventional or commercially available conductive fibers, which can be selected without undue experimentation by those skilled in the art based at least in part on requirements for a particular end-use application.

In some embodiments, the conductive fibers are selected from metal fibers, metal-coated fibers, metal-hybrid fibers, or combinations thereof.

In some embodiments, metal fibers are fibers including a metal. That is, metal fibers are fibers which can comprise, consist essentially of, or consist of a metal.

In some embodiments, metal-coated fibers are fibers including a non-metal coated with a metal. That is, metal fibers are fibers which can comprise, consist essentially of, or consist of a non-metal coated with a metal.

Non-limiting examples of suitable metals include aluminum, chromium, cobalt, copper, gold, iron, nickel, silver, stainless steel, tin, tungsten, zinc, alloys thereof, and combinations thereof.

Non-limiting examples of suitable non-metals include acrylic, aramid, carbon (graphite), nylon, polyester, polyolefin, and combinations thereof.

In some embodiments, the conductive fibers are selected from stainless steel fibers, nickel-coated carbon fibers, and combinations thereof.

Non-limiting examples of commercially available conductive fibers include those identified in Table 2 herein below.

In some embodiments, each of the conductive fibers is either a single filament or a bundle of two or more filaments.

According to the invention, as described above, at least a portion of the conductive fibers include long fibers. That is, the fiber length of each of at least a portion of the conductive fibers is substantially equivalent to the pellet length.

For example, in some embodiments, the fiber length of each of at least about 50%, or about 60%, or about 70%, or about 80%, or about 90%, or about 99%, or about 100%, of the conductive fibers is substantially equivalent to the pellet length.

In some embodiments, the pellet length ranges from about 5 mm to about 30 mm. Consequently, in such embodiments, the fiber length of long fibers is substantially commensurate with the pellet length and ranges from about 5 mm to about 30 mm.

In other embodiments, the pellet length ranges from about 6 mm to about 12 mm. Consequently, in such embodiments, the fiber length of long fibers is substantially commensurate with the pellet length and ranges from about 6 mm to about 12 mm.

In some embodiments, the conductive fibers are free of any short fibers.

Optional Additives

In some embodiments, the thermoplastic compounds include one or more optional additives.

Suitable optional additives include conventional or commercially available plastics additives. Those skilled in the art of thermoplastics compounding, without undue experimentation, can select suitable additives from available references, for example, E. W. Flick, "Plastics Additives Database," *Plastics Design Library* (Elsevier 2004).

Optional additives can be used in any amount that is sufficient to obtain a desired processing or performance property for the thermoplastic compound and/or the thermoplastic article. The amount should not be wasteful of the additive nor detrimental to the processing or performance of the thermoplastic compound and/or the thermoplastic article.

Non-limiting examples of additives suitable for use in the present invention include one or more selected from antioxidants and stabilizers; colorants; flame retardants; flow promoters; impact modifiers; processing aids; release agents; ultraviolet light absorbers; and combinations thereof.

Ranges of Ingredients in the Thermoplastic Compounds

Table 1 below shows acceptable, desirable, and preferable ranges of ingredients for some embodiments of the thermoplastic compounds of the invention in terms of weight percent based on total weight of the thermoplastic compound. Other possible ranges of ingredients for certain other embodiments of the present invention are as described elsewhere herein.

Thermoplastic compounds of the invention can comprise, consist essentially of, or consist of these ingredients. Any number between the ends of the ranges is also contemplated as an end of a range, such that all possible combinations are contemplated within the possibilities of Table 1 as embodiments of compounds for use in the invention. Unless expressly stated otherwise herein, any disclosed number is intended to refer to both exactly the disclosed number and "about" the disclosed number, such that either possibility is contemplated within the possibilities of Table 1 as embodiments of compounds for use in the invention.

TABLE 1

| | Thermoplastic Compound (wt. %) | | |
|---|---|---|---|
| Ingredient | Acceptable | Desirable | Preferable |
| Thermoplastic resin | 30 to 95 | 57 to 90 | 78 to 88 |
| Conductive fibers | 5 to 50 | 10 to 35 | 12 to 17 |
| Optional additives | 0 to 20 | 0 to 8 | 0 to 5 |

Processing

Some aspects of the invention are directed to methods of making the thermoplastic compounds as described herein.

Generally, a pultrusion process can be used to make the thermoplastic compounds in the form of a pellet as described herein.

More particularly, according to the invention, methods of making thermoplastic compounds in the form of a pellet as described herein include the following steps: (a) heating the thermoplastic resin to provide a resin melt; (b) spreading the conductive fibers to provide two or more physically separated tows of the conductive fibers; (c) pulling the physically separated tows of the conductive fibers through the resin melt to provide resin-enveloped conductive fibers; (d) cooling the resin-enveloped conductive fibers to provide the thermoplastic compound in the form of a pultruded profile; and (e) cutting the pultruded profile at the pellet length to provide the thermoplastic compound in the form of the pellet.

In some embodiments, the step of spreading includes threading the conductive fibers through a fiber spreader component or guiding the conductive fibers over a fiber spreader component.

In some embodiments, the step of spreading includes pulling the fibers over or through a tension bar.

In some embodiments, the method further includes a step of preheating the conductive fibers prior to the step of pulling the physically separated tows of the conductive fibers through the resin melt. It is believed such preheating helps to facilitate good wetting or impregnation of the conductive fibers by the thermoplastic resin.

Suitable pultrusion processes are described in available references, for example, Suresh G. Advani and Kuang-Ting Hsiao (editors), *Manufacturing Techniques for Polymer Matrix Composites (PMCs)* (Woodhead Publishing 2012), Guneri Akovali (editor), *Handbook of Composite Fabrication* (Rapra Technology 2001), Raymond W. Meyer, *Handbook of Pultrusion Technology* (Chapman and Hall 1985), S. T. Peters (editor), *Handbook of Composites,* 2nd edition (Springer Science+Business Media 1998), and Trevor F. Starr (editor), *Pultrusion for Engineers* (CRC Press 2000), each of which is hereby incorporated by reference in its entirety.

Subsequent preparation of thermoplastic articles of the invention is uncomplicated once the thermoplastic compounds are provided. For example, thermoplastic articles of the present invention can be made by any suitable melt forming process such as extrusion, injection molding, blow molding, rotational molding, thermoforming, calendering, and the like.

Processing techniques are described in available references, for example, Dominick V. Rosato et al., *Plastics Design Handbook* (Springer 2013).

Usefulness of the Invention

According to aspects of the invention, thermoplastic compounds, when molded at a thickness of about 3.2 mm, have an electromagnetic shielding effectiveness across a range of frequencies from about 0.5 GHz to about 2.0 GHz of at least about 60 dB according to ASTM D4935, which makes the thermoplastic compound useful for molding thermoplastic articles for use in electromagnetic interference shielding applications.

Non-limiting examples of such applications include housings, connectors, and other components for electronics. Other non-limiting examples of such applications include jacketing for wires and cables.

Non-limiting examples of markets and industries for such applications include aerospace, automotive, consumer, entertainment, financial, industrial, logistics, manufacturing, medical, retail, telecommunications, and transportation, among other markets or applications benefiting from the article's unique combination of properties.

EXAMPLES

Non-limiting examples of thermoplastic compounds of various embodiments of the invention are provided herein below.

Table 2 below shows sources of ingredients for the thermoplastic compounds of Examples 1 to 15.

TABLE 2

| Ingredient Description | Brand | Source |
|---|---|---|
| Nylon-6,6 (PA66) | TORZEN U3501 NC0 | Invista |
| Nylon-6,6 (PA66) | Zytel ® FE210021 NC010 | DuPont |
| Polybutylene terephthalate (PBT) | PBT Resin (110-211XG) | FRP |

TABLE 2-continued

| Ingredient Description | Brand | Source |
|---|---|---|
| Polycarbonate (PC) | CALIBRE 303EP31 | Trinseo |
| Polypropylene (PP) homopolymer | DuPure U76 | Ducor Petrochemicals |
| High density polyethylene (HDPE) copolymer | SABIC CC3054 | SABIC |
| Nickel CVD coated carbon long fiber | 12K40 | Conductive Composites |
| Stainless steel long fiber | BEKI-SHEILD 8/12000 | Bekaert |
| Stainless steel long fiber | BEKI-SHEILD 8/3000 (302) | Bekaert |
| Stainless steel long fiber | BEKI-SHEILD 11/2000 | Bekaert |
| Color concentrate | PLASBLAK PA 3735 | Delta Tecnic |
| Heat stabilizer | BRUGGOLEN H3351 | Brueggemann |
| Anhydride modified polyethylene | Fusabond E226 | DuPont |
| Heat stabilizer | SCONA TPPP 9112 GA | BYK |
| Heat stabilizer | AO PP 0694 | PolyOne |

Examples of the thermoplastic compound were pultruded at processing temperatures typically for the respective thermoplastic resin and cut into pellets. Subsequently, test specimens were prepared by injection molding and then evaluated for the reported properties.

Table 3 below shows the formulations and certain properties of Examples 1 to 3.

TABLE 3

| | Example | | |
|---|---|---|---|
| | 1 | 2 | 3 |
| | wt. % | | |
| Ingrediends | | | |
| TORZEN U3501 NC0 | 85.0 | — | — |
| ZYTEL FE210021 NC010 | — | 89.0 | 84.0 |
| 12K40 | 14.0 | — | — |
| BEKI-SHIELD 8/3000 (302) | — | 10.0 | 15.0 |
| PLASBLAK PA 3785 | 1.0 | — | — |
| BRUGGOLEN H3351 | — | 1.0 | 1.0 |
| TOTAL | 100.0 | 100.0 | 100.0 |
| Properties | | | |
| Pellet length (mm) | 6 | 12 | 6 |
| Specific gravity (ASTM D792) (unitless) | 1.2 | 1.2 | 1.3 |
| Tensile strength at break (ASTM D638) (MPa) | 126 | 80 | 82 |
| Flexural strength (ASTM D790) (MPa) | 186 | 133 | 136 |
| Flexural modulus (ASTM D790) (MPa) | 7793 | 3492 | 3684 |
| Izod impact, notched (ASTM D256) (ft-lb/in) | 1.10 | 1.00 | 0.87 |
| Izod impact, uunotched (ASTM D256) (ft-lb/in) | 6.30 | 13.00 | 10.60 |
| Shielding effectiveness (ASTM D4935) (dB) (0.5 GHz) (3.2 mm thickness) | 98 | 80 | 93 |
| Shielding effectiveness (ASTM D4935) (dB) (1.0 GHz) (3.2 mm thickness) | 112 | 87 | 103 |
| Shielding effectiveness (ASTM D4935) (dB) (1.5 GHz) (3.2 mm thickness) | 113 | 90 | 108 |
| Shielding effectiveness (ASTM D4935) (dB) (2.0 GHz) (3.2 mm thickness) | 107 | 94 | 106 |

Table 4 below shows the formulations and certain properties of Examples 4 to 6.

TABLE 4

| | Example | | |
|---|---|---|---|
| | 4 | 5 | 6 |
| | wt. % | | |
| Ingredients | | | |
| ZYTEL FE210021 NC010 | 84.0 | 84.0 | 84.0 |
| BEKI-SHIELD 8/3000 (302) | 15.0 | 15.0 | — |
| BEKI-SHEILD 11/2000 | — | — | 15.0 |
| BRUGGOLEN H3351 | 1.0 | 1.0 | 1.0 |
| TOTAL | 100.0 | 100.0 | 100.0 |
| Properties | | | |
| Pellet length (mm) | 12 | 36 | 12 |
| Specific gravity (ASTM D792) (unitless) | 1.3 | 1.3 | 1.3 |
| Tensile strength at break (ASTM D638) (MPa) | 80 | 78 | 78 |
| Flexural strength (ASTM D790) (MPa) | 141 | 135 | 136 |
| Flexural modulus (ASTM D790) (MPa) | 3901 | 3689 | 4036 |
| Izod impact, notched (ASTM D256) (ft-lb/in) | 0.84 | 0.77 | 0.80 |
| Izod impact, uunotched (ASTM D256) (ft-lb/in) | 8.4 | 7 | 8.6 |
| Shielding effectiveness (ASTM D4935) (dB) (0.5 GHz) (3.2 mm thickness) | 88 | 88 | 87 |
| Shielding effectiveness (ASTM D4935) (dB) (1.0 GHz) (3.2 mm thickness) | 99 | 96 | 98 |
| Shielding effectiveness (ASTM D4935) (dB) (1.5 GHz) (3.2 mm thickness) | 103 | 99 | 103 |
| Shielding effectiveness (ASTM D4935) (dB) (2.0 GHz) (3.2 mm thickness) | 99 | 94 | 93 |

Table 5 below shows the formulations and certain properties of Examples 7 to 9.

TABLE 5

| | Example | | |
|---|---|---|---|
| | 7 | 8 | 9 |
| | wt. % | | |
| Ingredients | | | |
| ZYTEL FE210021 NC010 | 79.0 | 69.0 | — |
| CALIBRE 303EP31 | — | — | 84.0 |
| BEKI-SHEILD 8/12000 | — | 30.0 | — |
| BEKI-SHIELD 8/3000 (302) | 20.0 | — | 15.0 |
| BRUGGOLEN H 3351 | 1.0 | 1.0 | 1.0 |
| TOTAL | 100.0 | 100.0 | 100.0 |
| Properties | | | |
| Pellet length (mm) | 12 | 12 | 12 |
| Specific gravity (ASTM D792) (unitless) | 1.4 | 1.5 | 1.4 |
| Tensile strength at break (ASTM D638) (MPa) | 81 | 82 | 30.6 |
| Flexural strength (ASTM D790) (MPa) | 138 | 134 | 58.1 |
| Flexural modulus (ASTM D790) (MPa) | 4189 | 4995 | 3557 |
| Izod impact, notched (ASTM D256) (ft-lb/in) | 0.80 | 0.70 | 0.30 |
| Izod impact, uunotched (ASTM D256) (ft-lb/in) | 6.60 | — | 4.50 |

TABLE 5-continued

|  | Example | | |
|---|---|---|---|
|  | 7 | 8 wt. % | 9 |
| Shielding effectiveness (ASTM D4935) (dB) (0.5 GHz) (3.2 mm thickness) | 92 | 92 | 94 |
| Shielding effectiveness (ASTM D4935) (dB) (1.0 GHz) (3.2 mm thickness) | 105 | 106 | 105 |
| Shielding effectiveness (ASTM D4935) (dB) (1.5 GHz) (3.2 mm thickness) | 110 | 114 | 114 |
| Shielding effectiveness (ASTM D4935) (dB) (2.0 GHz) (3.2 mm thickness) | 104 | 109 | 100 |

Table 6 below shows the formulations and certain properties of Examples 10 to 12.

TABLE 6

|  | Example | | |
|---|---|---|---|
|  | 10 | 11 wt. % | 12 |
| Ingredients | | | |
| PBT Resin (110-211XG) | 69.0 | 85.0 | 68.5 |
| BEKI-SHEILD 8/12000 | 30.0 | — | — |
| BEKI-SHEILD BU 8/3000 (302) | — | 15.0 | 30.0 |
| PLASBLAK PA 3785 | 1.0 | — | — |
| BRUGGOLEN H 3351 | — | — | 1.5 |
| TOTAL | 100.0 | 100.0 | 100.0 |
| Properties | | | |
| Pellet length (mm) | 12 | 12 | 6 |
| Specific gravity (ASTM D792) (unitless) | 1.6 | 1.5 | 1.7 |
| Tensile strength at break (ASTM D638) (MPa) | 45 | 62 | 66.5 |
| Flexural strength (ASTM D790) (MPa) | — | 103 | 109 |
| Flexural modulus (ASTM D790) (MPa) | — | 3410 | 4576 |
| Izod impact, notched (ASTM D256) (ft-lb/in) | — | 0.70 | 0.70 |
| Izod impact, uunotched (ASTM D256) (ft-lb/in) | — | 5.70 | 4.90 |
| Shielding effectiveness (ASTM D4935) (dB) (0.5 GHz) (3.2 mm thickness) | 97 | 91 | 100 |
| Shielding effectiveness (ASTM D4935) (dB) (1.0 GHz) (3.2 mm thickness) | 107 | 97 | 108 |
| Shielding effectiveness (ASTM D4935) (dB) (1.5 GHz) (3.2 mm thickness) | 104 | 104 | 111 |
| Shielding effectiveness (ASTM D4935) (dB) (2.0 GHz) (3.2 mm thickness) | 101 | 98 | 100 |

Table 7 below shows the formulations and certain properties of Examples 13 to 15.

TABLE 7

|  | Example | | |
|---|---|---|---|
|  | 13 | 14 wt. % | 15 |
| Ingredients | | | |
| PBT Resin (110-211XG) | 68.5 | — | — |
| DUPURE U76 | — | — | 82.4 |
| SABIC CC3054 | — | 80.0 | — |
| BEKI-SHEILD 8/12000 | 30.0 | — | — |
| BEKI-SHEILD BU 8/3000 (302) | — | 15.0 | 15.0 |
| BRUGGOLEN H 3351 | 1.5 | — | — |
| FUSABOND E226 | — | 5.0 | — |
| SCONA TPPP 9112 GA | — | — | 1.6 |
| AO PP 0694 | — | — | 1.0 |
| TOTAL | 100.0 | 100.0 | 100.0 |

TABLE 7-continued

|  | Example | | |
|---|---|---|---|
|  | 13 | 14 wt. % | 15 |
| Properties | | | |
| Pellet length (mm) | 6 | 12 | 12 |
| Specific gravity (ASTM D792) (unitless) | 1.7 | 1.1 | 1.0 |
| Tensile strength at break (ASTM D638) (MPa) | 65 | 20 | 36 |
| Flexural strength (ASTM D790) (MPa) | 110 | 32 | 61 |
| Flexural modulus (ASTM D790) (MPa) | 4691 | 1343 | 2478 |
| Izod impact, notched (ASTM D256) (ft-lb/in) | 0.60 | 0.70 | 0.50 |
| Izod impact, uunotched (ASTM D256) (ft-lb/in) | 5.50 | 6.90 | 2.70 |
| Shielding effectiveness (ASTM D4935) (dB) (0.5 GHz) (3.2 mm thickness) | 98 | 93 | 82 |
| Shielding effectiveness (ASTM D4935) (dB) (1.0 GHz) (3.2 mm thickness) | 105 | 106 | 102 |
| Shielding effectiveness (ASTM D4935) (dB) (1.5 GHz) (3.2 mm thickness) | 111 | 109 | 102 |
| Shielding effectiveness (ASTM D4935) (dB) (2.0 GHz) (3.2 mm thickness) | 102 | 99 | 100 |

Figure 6:
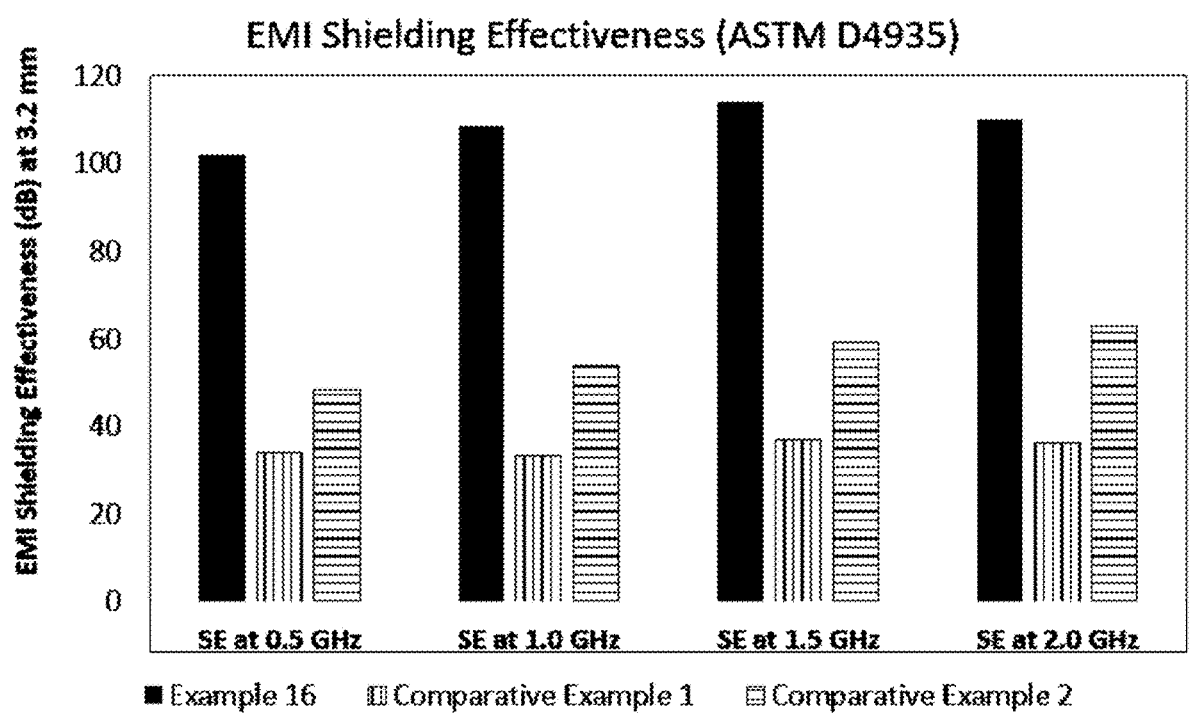
FIG. 6 is a bar graph showing the shielding effectiveness (ASTM D4953) of an exemplary embodiment of the present invention compared to two comparative examples, both of which are not exemplary of the invention.

As shown in FIG. 6, the shielding effectiveness (tested with AST D4935) compared a plaque using Example 16, an exemplary embodiment of a thermoplastic compound containing long fibers with a plaque using Comparative Example 1, an comparative example embodiment of a thermoplastic compound containing long fibers passed through an extruder, and plaque using Comparative Example 2, an comparative example embodiment of a thermoplastic compound containing short fibers, wherein all other components of the three plaques were identical.

Figure 7:
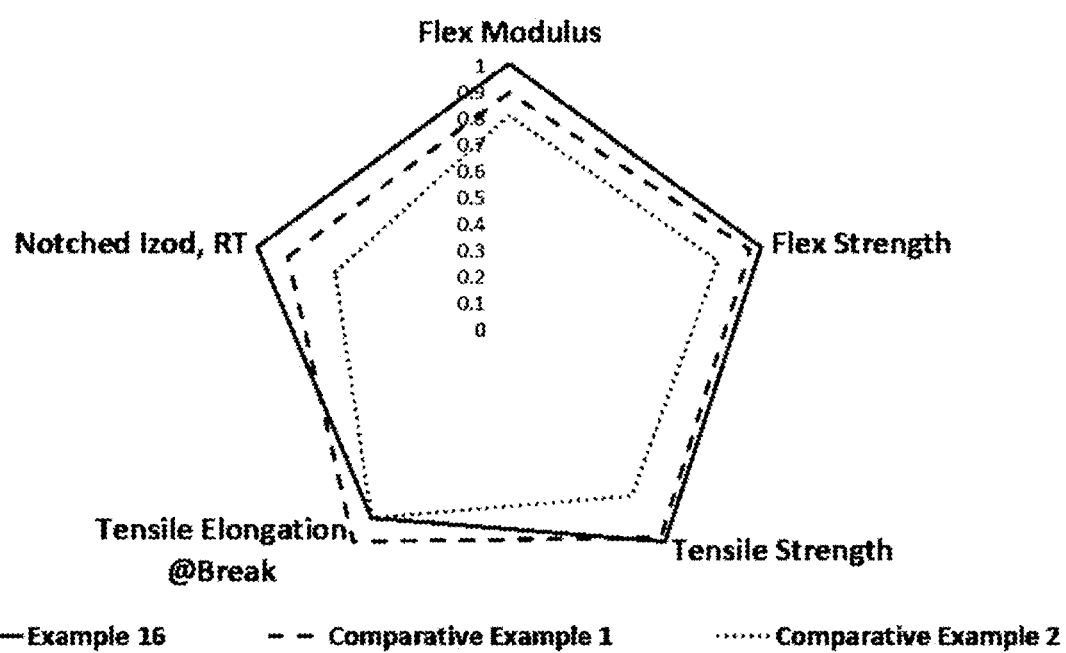
FIG. 7 is a spider graph comparing the mechanical properties of an exemplary embodiment of the present invention compared to two comparative examples, both of which are not exemplary of the invention.

FIG. 7 shows a relative comparison of the physical characteristics of Example 16 and Comparative Examples 1 and 2, wherein the physical characteristics of Example 16 are the outermost line at 1.0 for each physical characteristic.

Figure 8:
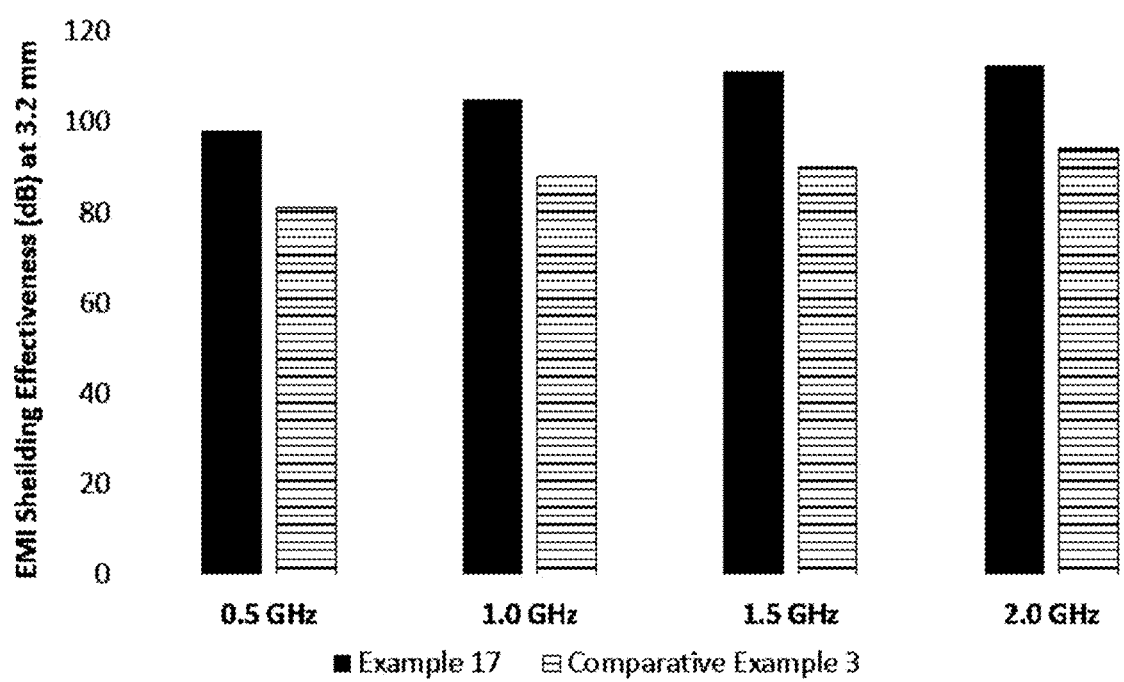
FIG. 8 is a bar graph comparing the EMI shielding effectiveness of a thermoplastic compound of an exemplary embodiment and a comparative thermoplastic, which is not exemplary of the invention.
Figure 9A:
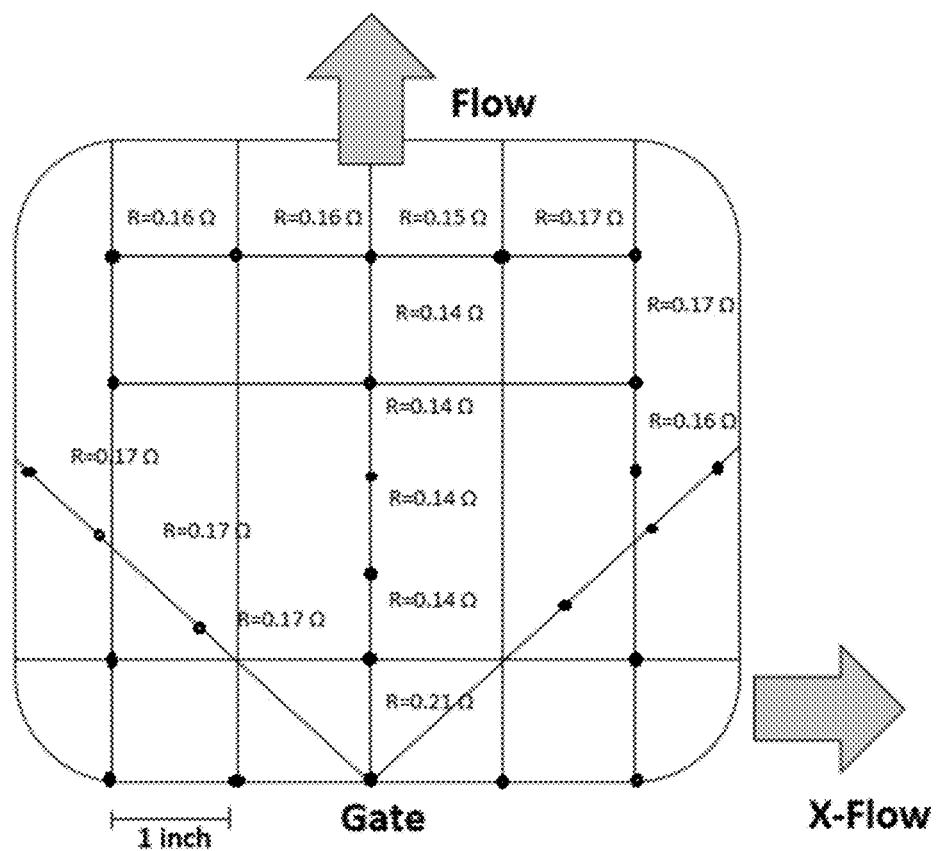
FIG. 9A show resistance measurements across a thermoplastic plaque of an exemplary embodiment.
Figure 9B:
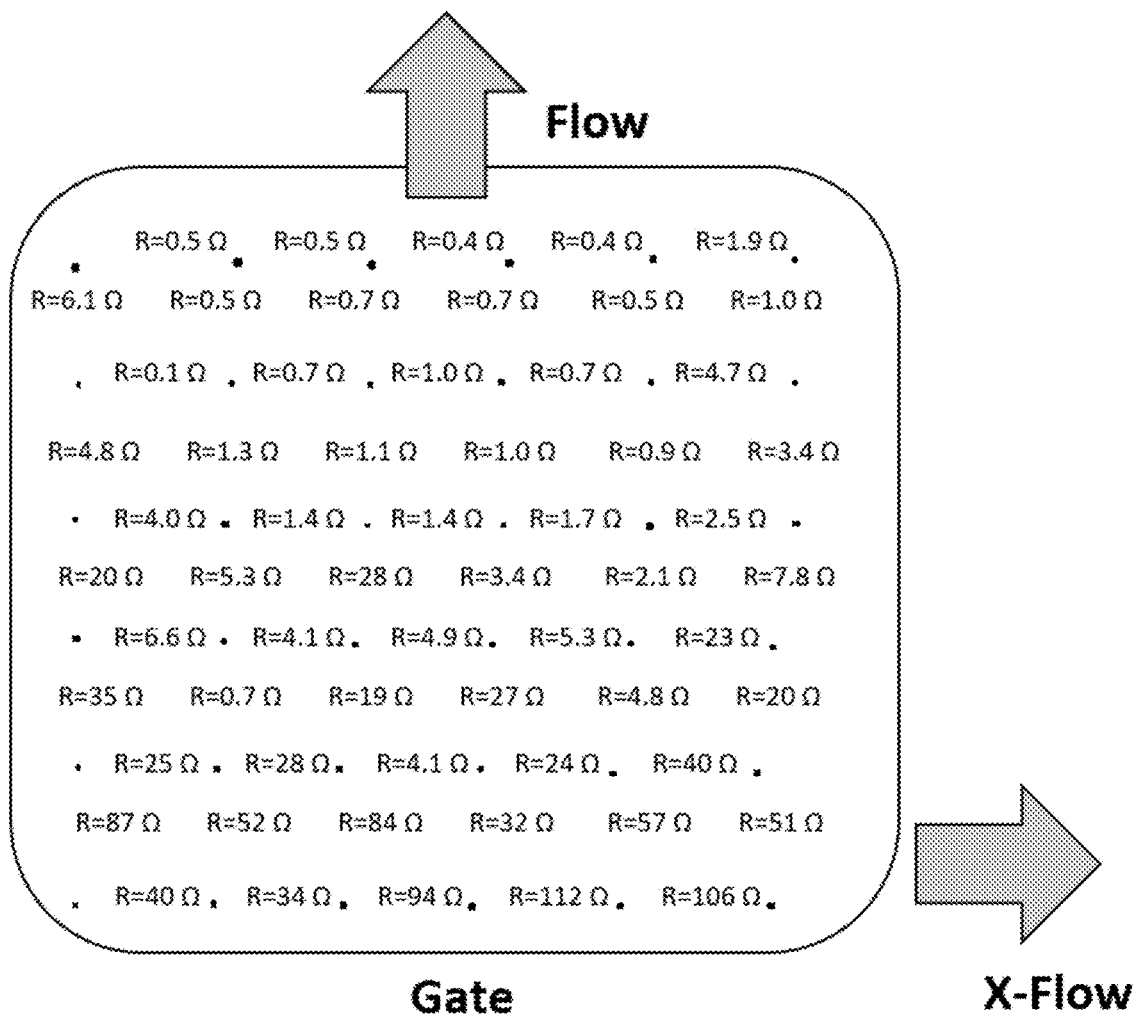
FIG. 9B show resistance measurements across a comparative thermoplastic plaque, which is not exemplary of the invention.

As shown in FIG. 8, Example 17, a thermoplastic compound containing more fully impregnated fibers, shows improved EMI shielding effectiveness when compared with Comparative Example 3, a thermoplastic compound containing conductive fibers configured as a collective bundle. Additionally. Example 18 of FIG. 9A, a thermoplastic compound containing more fully impregnated fibers of the present invention, has lower, more uniform resistance readings when compared with Comparative Example 4 in FIG. 9B, a thermoplastic compound containing conductive fibers configured as collective bundles, which shows higher and varied resistance readings based on location of the collective bundles of fibers, i.e., showing poor fiber dispersion.

Without undue experimentation, those having ordinary skill in the art can utilize the written description, including the Examples, to make and use aspects of the invention.

All documents cited in the Embodiments of the Invention are incorporated herein by reference in their entirety unless otherwise specified. The citation of any document is not to be construed as an admission that it is prior art with respect to the invention.

While particular embodiments of the invention have been illustrated and described, it would be obvious to those skilled in the art that various other changes and modifications can be made without departing from the spirit and scope of the invention. The appended claims are intended to cover all such changes and modifications that are within the scope of the invention.

What is claimed is:

1. A thermoplastic compound in the form of a pellet, the thermoplastic compound comprising:
   (a) thermoplastic resin; and
   (b) conductive fibers enveloped by the thermoplastic resin and distributed within the pellet such that each of at least 50% of the conductive fibers is substantially surrounded by the thermoplastic resin and thereby substantially separated from physical contact with any other of the conductive fibers;
   wherein the pellet has a pellet length and each of the conductive fibers has a fiber length, and wherein the fiber length of each of at least a portion of the conductive fibers is substantially equivalent to the pellet length; and
   wherein the thermoplastic compound, when molded at a thickness of about 3.2 mm, has an electromagnetic shielding effectiveness across a range of frequencies from about 0.5 GHz to about 2.0 GHz of at least about 60 dB according to ASTM D4935.

2. The thermoplastic compound of claim 1, wherein each of at least about 99% of the conductive fibers is substantially surrounded by the thermoplastic resin and thereby substantially separated from physical contact with any other of the conductive fibers.

3. The thermoplastic compound of claim 1, each of at least the portion of the conductive fibers is oriented such that the fiber length is substantially parallel to the pellet length.

4. The thermoplastic compound of claim 1, wherein the fiber length of each of at least about 50% of the conductive fibers is substantially equivalent to the pellet length and each of at least about 50% of the conductive fibers is oriented such that the fiber length is substantially parallel to the pellet length.

5. The thermoplastic compound of claim 1, wherein the fiber length of each of at least about 99% of the conductive fibers is substantially equivalent to the pellet length and each of at least about 99% of the conductive fibers is oriented such that the fiber length is substantially parallel to the pellet length.

6. The thermoplastic compound of claim 3, wherein the pellet length ranges from about 5 mm to about 30 mm.

7. The thermoplastic compound of claim 3, wherein the pellet length ranges from about 6 mm to about 12 mm.

8. The thermoplastic compound of claim 1, wherein each of the conductive fibers consists of either a single filament or a bundle of two or more filaments.

9. The thermoplastic compound of claim 1, wherein the conductive fibers are selected from metal fibers, metal-coated fibers, metal-hybrid fibers, or combinations thereof.

10. The thermoplastic compound of claim 9, wherein the metal fibers are selected from fibers comprising aluminum, chromium, cobalt, copper, gold, iron, nickel, silver, stainless steel, tin, tungsten, zinc, alloys thereof, and combinations thereof.

11. The thermoplastic compound of claim 9, wherein each of the metal-coated fibers comprises a non-metal fiber coated with a metal, wherein the non-metal fiber is selected from fiber of acrylic, aramid, carbon, nylon, polyester, polyolefin, and combinations thereof, and the metal is selected from aluminum, chromium, cobalt, copper, gold, iron, nickel, silver, stainless steel, tin, tungsten, zinc, alloys thereof, and combinations thereof.

12. The thermoplastic compound of claim 1, wherein the conductive fibers are selected from stainless steel fibers, nickel-coated carbon fibers, and combinations thereof.

13. The thermoplastic compound of claim 1, wherein the thermoplastic resin is selected from polyacetals, polyacrylates, acrylonitrile butadiene styrene, polyamides, polyaliphaticetherketones, polyaryletherketones, polycarbonates, polyesters, polyimides, polyolefins, polyphenylene ethers, polystyrenes, polysulfones, polyurethanes, polyvinyl halides, thermoplastic elastomers, and combinations thereof.

14. The thermoplastic compound of claim 1, wherein the thermoplastic resin is selected from nylon-6, nylon-6,6, polycarbonate, polybutylene terephthalate, high density polyethylene, polypropylene, syndiotactic polystyrene, and combinations thereof.

15. The thermoplastic compound of claim 1, wherein the thermoplastic compound has a specific gravity of about 2.0 or less.

16. The thermoplastic compound of claim 1, wherein the thermoplastic compound has a specific gravity of about 1.8 or less.

17. The thermoplastic compound of claim 1, wherein the conductive fibers are present in an amount from about 5 to about 50 percent by weight of the thermoplastic compound.

18. The thermoplastic compound of claim 17, wherein the electromagnetic shielding effectiveness across a range of frequencies from about 0.5 GHz to about 2.0 GHz is at least about 80 dB according to ASTM D4935.

19. The thermoplastic compound of claim 17, wherein the conductive fibers are present in an amount from about 10 to about 35 percent by weight of the thermoplastic compound; wherein the conductive fibers are selected from stainless steel fibers, nickel-coated carbon fibers, and combinations thereof; and wherein the electromagnetic shielding effectiveness across a range of frequencies from about 0.5 GHz to about 2.0 GHz is at least about 90 dB according to ASTM D4935.

20. The thermoplastic compound of claim 17, wherein the conductive fibers are present in an amount from about 12 to about 17 percent by weight of the thermoplastic compound; wherein the conductive fibers are selected from stainless steel fibers, nickel-coated carbon fibers, and combinations thereof; and wherein the electromagnetic shielding effectiveness across a range of frequencies from about 0.5 GHz to about 2.0 GHz is at least about 90 dB according to ASTM D4935.

21. The thermoplastic compound of claim 1, further comprising one or more additives selected from antioxidants and stabilizers; colorants; flame retardants; flow promoters; impact modifiers; processing aids; release agents; ultraviolet light absorbers; and combinations thereof.

22. A thermoplastic article for shielding electromagnetic interference, wherein the thermoplastic article is molded from the thermoplastic compound of claim 1.

23. A method of making the thermoplastic compound of claim 1, the method comprising the steps of:
   (a) heating the thermoplastic resin to provide a resin melt;
   (b) spreading the conductive fibers to provide two or more physically separated tows of the conductive fibers;
   (c) pulling the physically separated tows of the conductive fibers through the resin melt to provide resin-enveloped conductive fibers;
   (d) cooling the resin-enveloped conductive fibers to provide the thermoplastic compound in the form of a pultruded profile; and
   (e) cutting the pultruded profile to provide the thermoplastic compound in the form of the pellet.

24. The method of claim 23, wherein the step of spreading comprises threading the conductive fibers through a fiber spreader component or guiding the conductive fibers over a fiber spreader component in a pultrusion process.

* * * * *